US007005751B2

(12) United States Patent
Khandros et al.

(10) Patent No.: US 7,005,751 B2
(45) Date of Patent: Feb. 28, 2006

(54) LAYERED MICROELECTRONIC CONTACT AND METHOD FOR FABRICATING SAME

(75) Inventors: Igor Y. Khandros, Orinda, CA (US); Charles A. Miller, Fremont, CA (US); Stuart W. Wenzel, San Francisco, CA (US)

(73) Assignee: FormFactor, Inc., Livermore, CA (US)

( * ) Notice: Subject to any disclaimer, the term of this patent is extended or adjusted under 35 U.S.C. 154(b) by 43 days.

(21) Appl. No.: 10/410,948

(22) Filed: Apr. 10, 2003

(65) Prior Publication Data

US 2004/0201074 A1 Oct. 14, 2004

(51) Int. Cl.
*H01L 23/48* (2006.01)

(52) U.S. Cl. ......................... 257/780; 257/773; 29/842

(58) Field of Classification Search ................ 257/773, 257/780

See application file for complete search history.

(56) References Cited

U.S. PATENT DOCUMENTS 3,881,799 A 5/1975 Elliott et al.
4,466,184 A 8/1984 Cuneo et al.
5,090,118 A 2/1992 Kwon et al.
5,092,782 A 3/1992 Beaman
5,109,596 A 5/1992 Driller et al.
5,172,050 A 12/1992 Swapp
5,177,438 A 1/1993 Littlebury et al.
5,187,020 A 2/1993 Kwon et al.
5,465,611 A 11/1995 Ruf et al.
5,476,818 A 12/1995 Yanof et al.
5,629,137 A 5/1997 Leedy
5,812,378 A 9/1998 Fjelstad et al.
5,864,946 A 2/1999 Eldridge et al.
6,031,282 A 2/2000 Jones et al.

(Continued)

FOREIGN PATENT DOCUMENTS

DE 10 239 080 11/2004

(Continued)

OTHER PUBLICATIONS

Leung, et al., "Active Substrate Membrane Probe Card", Technical Digest of the International Electron Devices Meeting (IEDM), pp. 709-712, (Oct. 12, 1995).

(Continued)

*Primary Examiner*—Douglas A. Wille
(74) *Attorney, Agent, or Firm*—N. Kenneth Burraston

(57) ABSTRACT

A microelectronic spring contact for making electrical contact between a device and a mating substrate and method of making the same are disclosed. The spring contact has a compliant pad adhered to a substrate of the device and spaced apart from a terminal of the device. The compliant pad has a base adhered to the substrate, and side surfaces extending away from the substrate and tapering to a smaller end area distal from the substrate. A trace extends from the terminal of the device over the compliant pad to its end area. At least a portion of the compliant pad end area is covered by the trace, and a portion of the trace that is over the compliant pad is supported by the compliant pad. A horizontal microelectronic spring contact and method of making the same are also disclosed. The horizontal spring contact has a rigid trace attached at a first end to a terminal of a substrate. The trace is free from attachment at its second end, and extends from the terminal in a direction substantially parallel to a surface of the substrate to the second end. At least a distal portion of the trace extending to the second end is spaced apart from the surface of the substrate. The spaced-apart distal portion is flexible in a plane parallel to the substrate.

22 Claims, 7 Drawing Sheets

U.S. PATENT DOCUMENTS

| | | | | |
|---|---|---|---|---|
| 6,059,982 | A | 5/2000 | Palagonia et al. | |
| 6,204,455 | B1 | 3/2001 | Gilleo et al. | |
| 6,351,885 | B1 * | 3/2002 | Suzuki et al. | 29/847 |
| 6,499,216 | B1 * | 12/2002 | Fjelstad | 29/842 |
| 6,659,778 | B1 | 12/2003 | Li | |
| 6,672,876 | B1 | 1/2004 | Takekoshi | |
| 2003/0019836 | A1 | 1/2003 | Clements et al. | |
| 2003/0067755 | A1 | 10/2003 | Pohl et al. | |

FOREIGN PATENT DOCUMENTS

| | | |
|---|---|---|
| JP | 6-018555 | 1/1994 |
| JP | 6-313775 | 8/1994 |
| JP | 6-265575 | 9/1994 |
| JP | 7-333232 | 12/1995 |

OTHER PUBLICATIONS

Kong et al., "Interated Electrostatically Resonant Scan Tip for an Atomic Force Microscope", Journal of Vacuum Science & Technology B, vol. 11, No. 3, pp. 634-641, Jun. 1993.

* cited by examiner

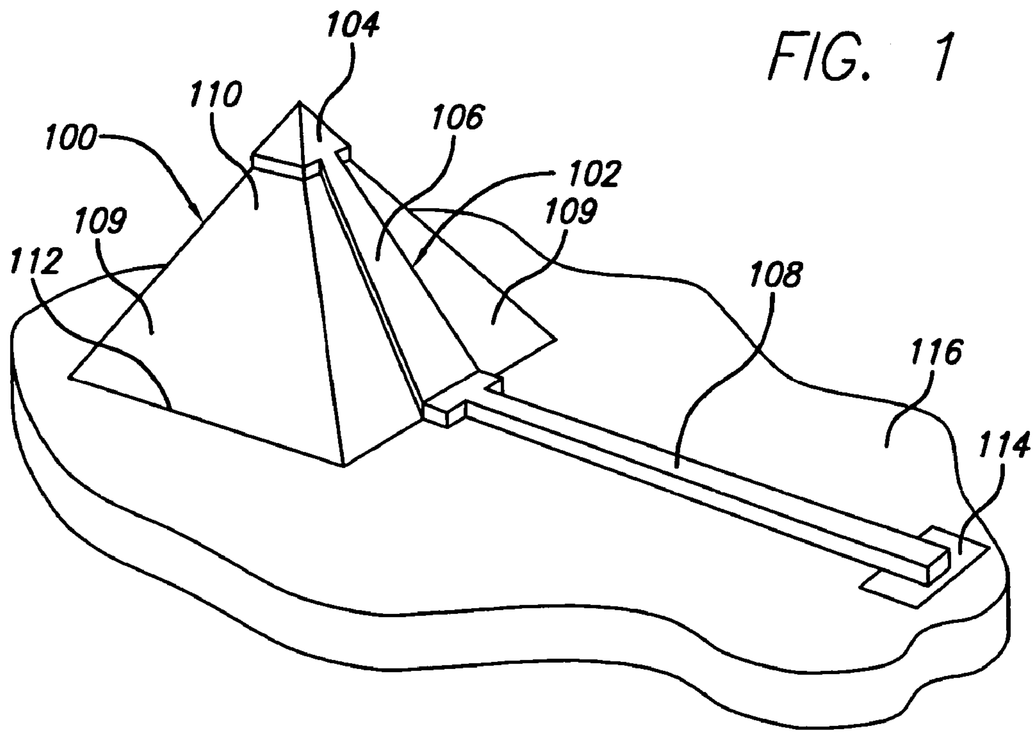
FIG. 1
FIG. 2
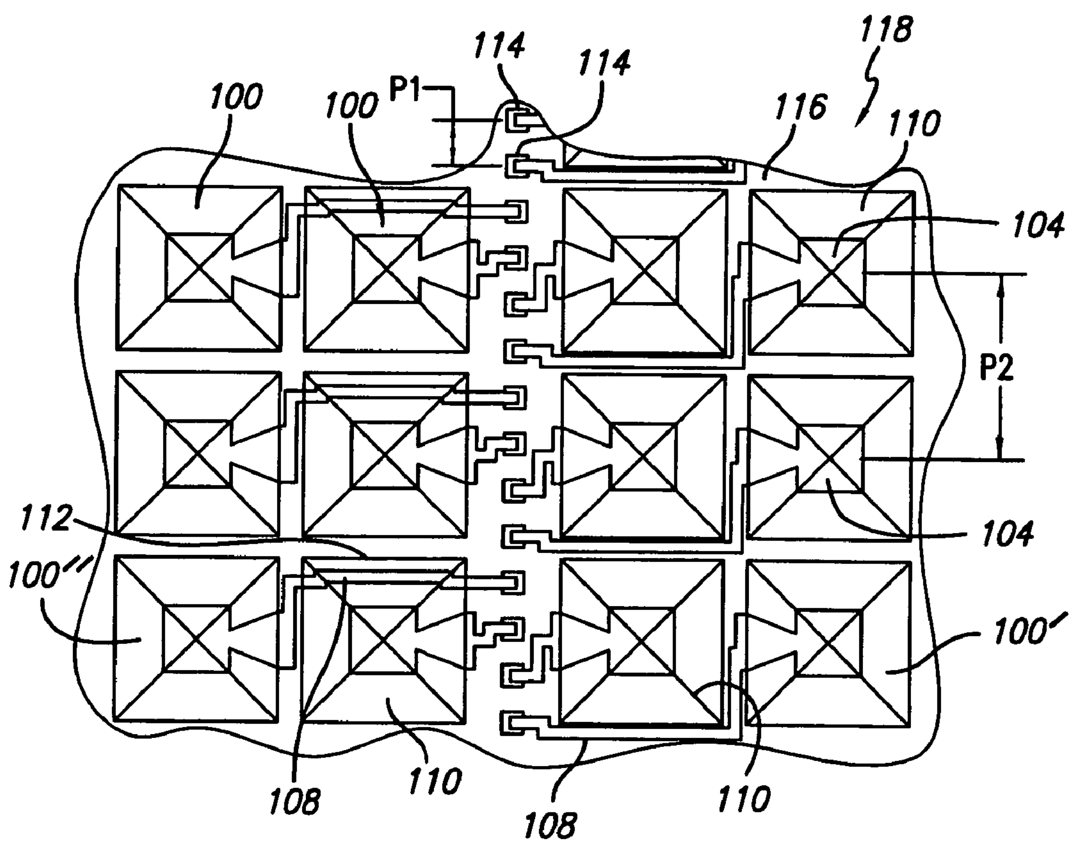

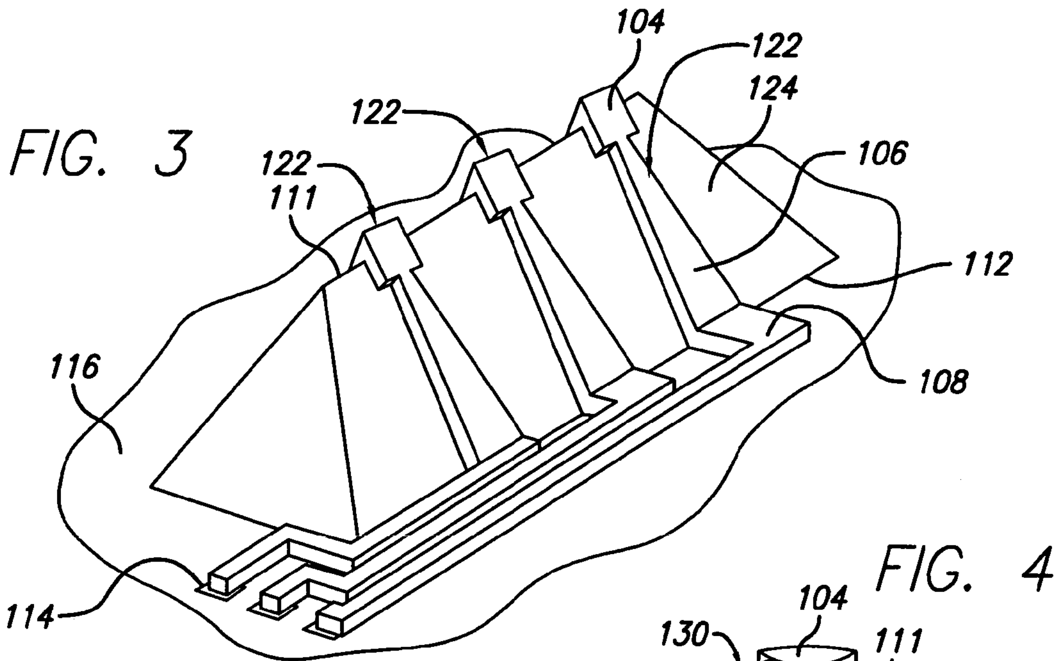
FIG. 3
FIG. 4
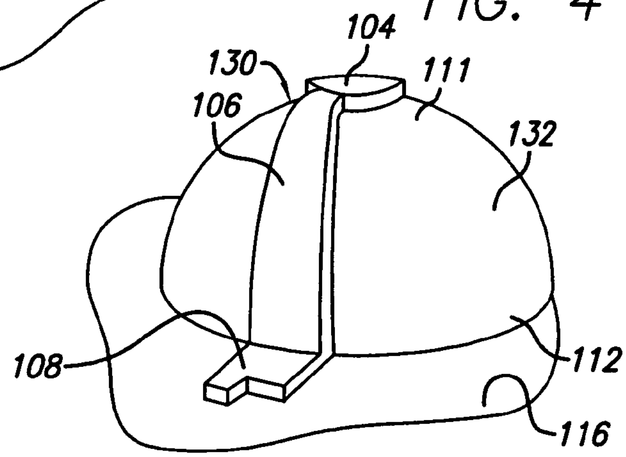
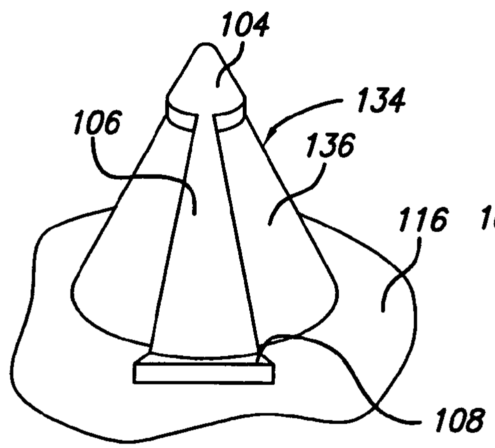
FIG. 5
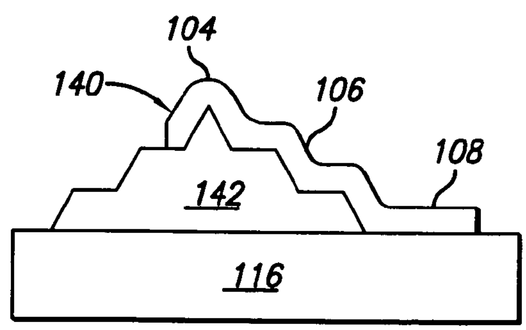
FIG. 6
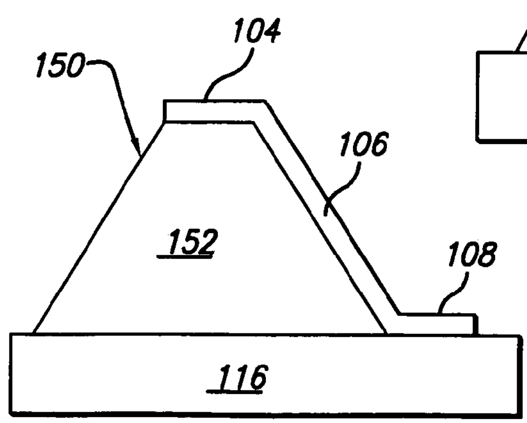
FIG. 7

FIG. 12
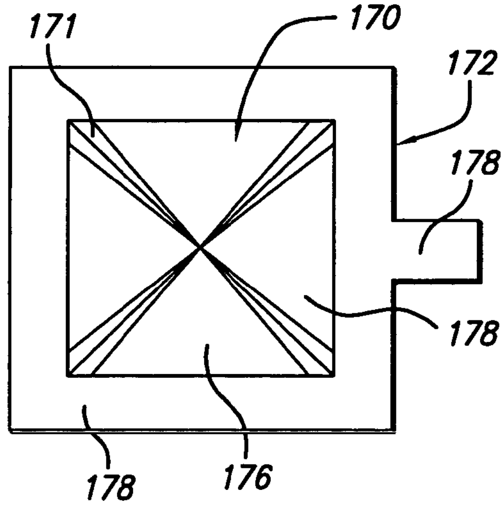
FIG. 13
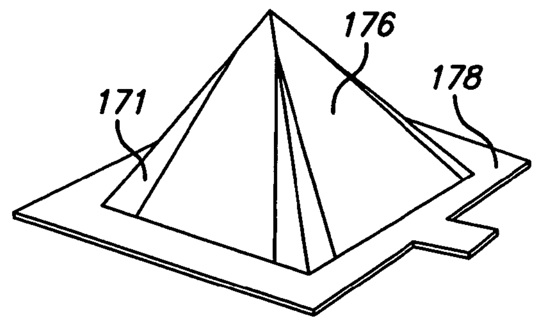
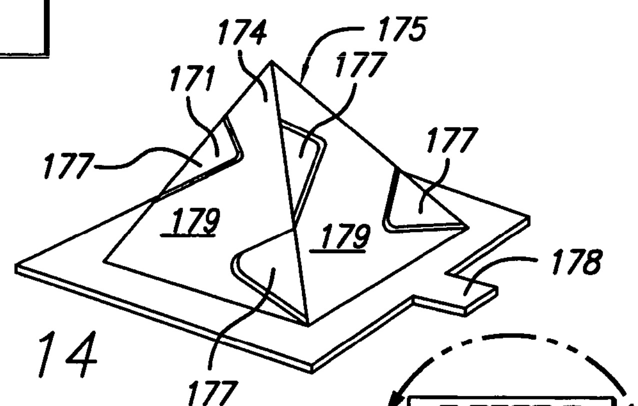
FIG. 14
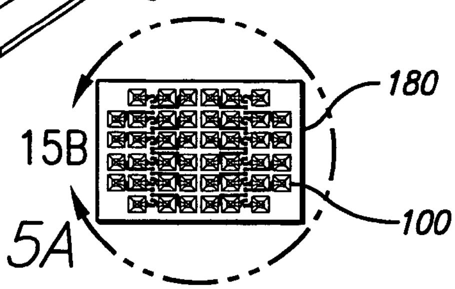
FIG. 15A
FIG. 15B
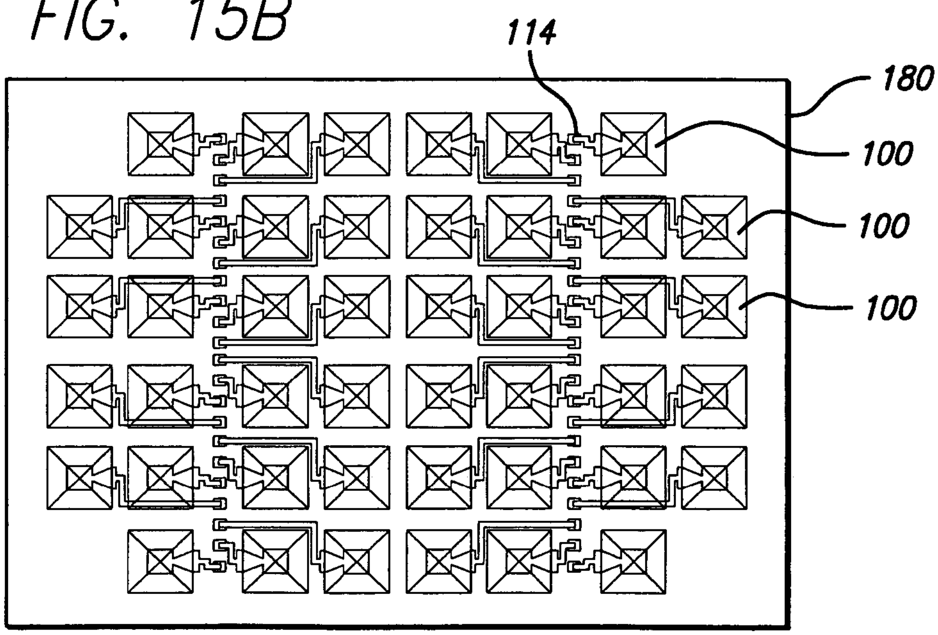

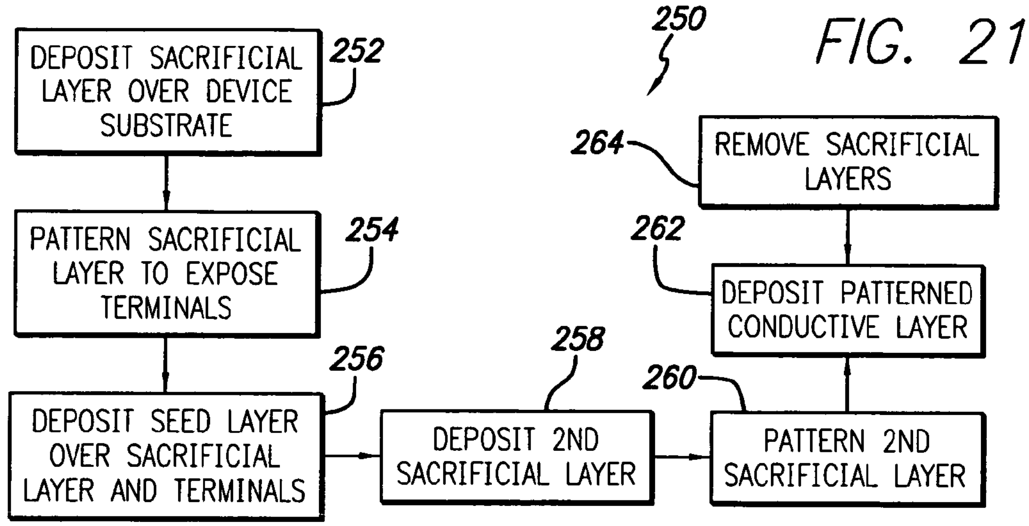
FIG. 21
FIG. 22
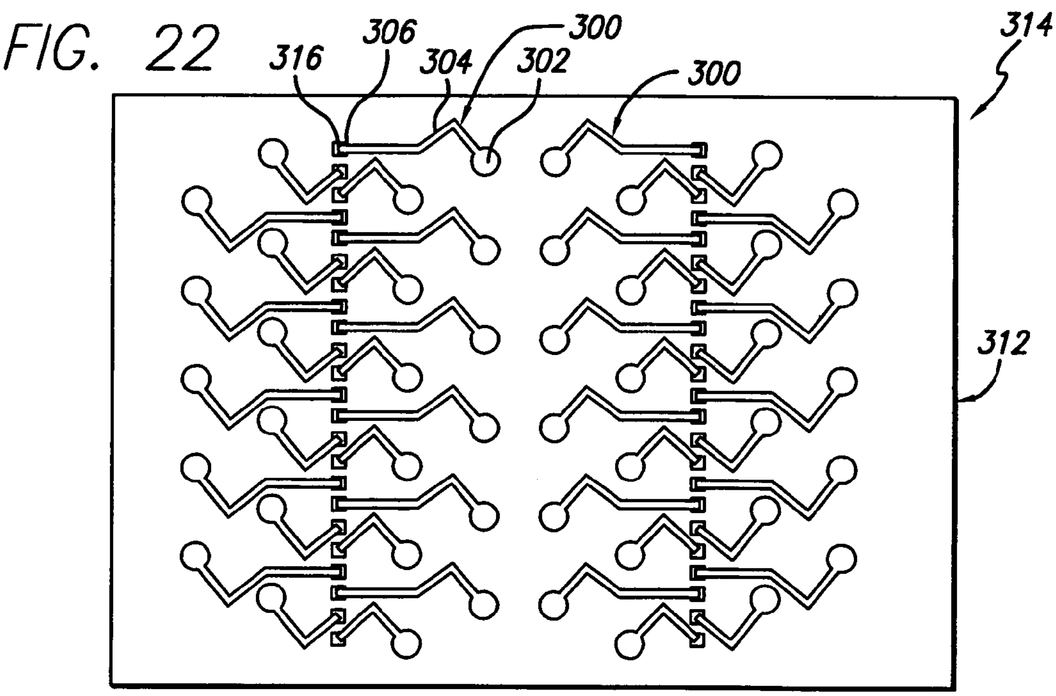
FIG. 23
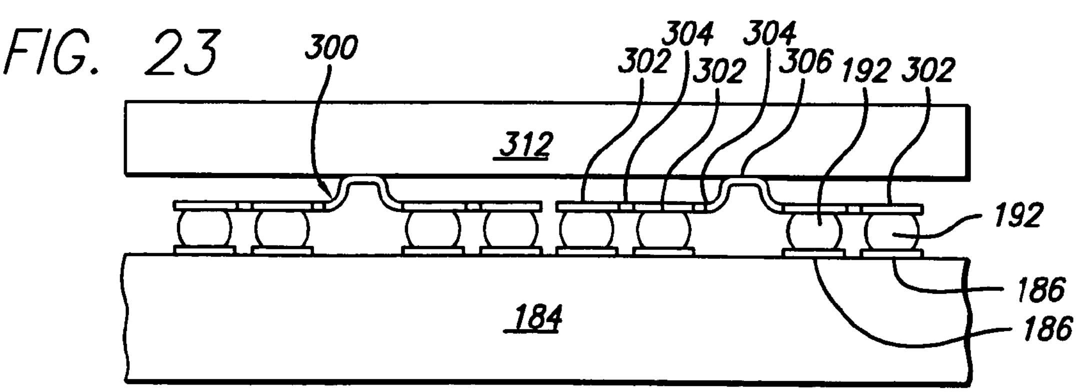

LAYERED MICROELECTRONIC CONTACT AND METHOD FOR FABRICATING SAME

BACKGROUND OF THE INVENTION

1. Field of the Invention

The present invention relates to microelectronic contacts for use with semiconductor devices and the like.

2. Description of Related Art

The demand for ever-smaller and more sophisticated electronic components has driven a need for smaller and more complex integrated circuits (ICs). The ever-smaller ICs and high lead counts, in turn, require more sophisticated electrical connection schemes, both in packaging for permanent or semi-permanent attachment, and for readily demountable applications such as testing and burn-in.

For example, many modern IC packages have smaller footprints, higher lead counts and better electrical and thermal performance than IC packages commonly used only a few years ago. One such compact IC package is the ball grid array (BGA) package. A BGA package is typically a rectangular package with terminals, normally in the form of an array of solder balls, protruding from the bottom of the package. These terminals are designed to be mounted onto a plurality of bonding pads located on the surface of a printed circuit board (PCB) or other suitable substrate. The solder balls of the array are caused to reflow and bond with bonding pads (terminals) on a mating component, such as by passing the component with the mounted BGA package through an ultrasound chamber or like thermal energy source, and then removing the energy source to cool and harden the solder and form a relatively permanent bond. Once melted and re-hardened, the solder ball connections cannot readily be re-used, if at all. Hence, separate, readily demountable contact elements are required to contact the terminal pads of the IC or the solder balls of the BGA package during testing and burn-in.

The advantages of readily demountable contact elements for use in compact packaging and connection schemes have previously been recognized. Readily demountable, flexible and resilient microelectronic spring contacts for mounting directly to substrates such as ICs are described in U.S. Pat. No. 5,917,707 to Khandros et al. Among other things, the '707 patent discloses microelectronic spring contacts that are made using a wire bonding process that involves bonding a very fine wire to a substrate, and subsequent electroplating of the wire to form a resilient element. These microelectronic contacts have provided substantial advantages in applications such as back-end wafer processing, and particularly for use as contact structures for probe cards, where they have replaced fine tungsten wires. These same or similar contact elements may also be used to make electrical connections between semiconductor devices in general, for making both temporary (readily demountable) and more permanent electrical connections in almost every type of electronic device.

Presently, however, the cost of fabricating fine-pitch spring contacts has limited their range of applicability to less cost-sensitive applications. Much of the fabrication cost is associated with manufacturing equipment and process time. Contacts as described in the aforementioned patents are fabricated in a serial process (i.e., one at a time) that cannot be readily converted into a parallel, many-at-a-time process. Thus, new types of contact structures, referred to herein as lithographic type microelectronic spring contacts, have been developed, using lithographic manufacturing processes that are well suited for producing multiple spring structures in parallel, thereby greatly reducing the cost associated with each contact.

Exemplary lithographic type spring contacts, and processes for making them, are described in the commonly owned, co-pending U.S. patent applications Ser. No. 09/032,473 filed Feb. 26, 1998, by Pedersen and Khandros, entitled LITHOGRAPHICALLY DEFINED MICROELECTRONIC CONTACT STRUCTURES," and Ser. No. 60/073,679, filed Feb. 4, 1998, by Pedersen and Khandros, entitled "MICROELECTRONIC CONTACT STRUCTURES." These applications disclose methods for fabricating the spring structures using a series of lithographic steps, thereby building up the height of the spring contact with several layers of plated metal that may be patterned using various lithographic techniques. Microelectronic spring contacts are preferably provided with ample height to compensate for any unevenness in the mounting substrate and to provide space for mounting components, such as capacitors, under the spring contact.

Methods of achieving adequate height in a single lithographic step, i.e., a single resilient layer, and exemplary structures made thereby, are disclosed in the commonly owned, co-pending U.S. patent applications Ser. No. 09/364,788, filed Jul. 30, 1999 by Eldridge and Mathieu, entitled "INTERCONNECT ASSEMBLIES AND METHODS," and Ser. No. 09/710,539, filed Nov. 9, 2000, by Eldridge and Wenzel, entitled "LITHOGRAPHIC SCALE MICROELECTRONIC SPRING STRUCTURES WITH IMPROVED CONTOURS." The foregoing applications disclose spring elements made from a single layer of metal. The metal layer is plated over a patterned three-dimensional layer of sacrificial material, which has been shaped using a micromachining or molding process. The sacrificial layer is then removed, leaving a free-standing spring contact having the contoured shape of the removed layer.

A need therefore exists for an improved microelectronic spring contact, and method of making it, that achieves or improves upon the performance of multi-layer and single-layer spring contacts at a substantially lower cost. The spring contact should be useful in very dense fine-pitch arrays for directly connecting to IC's and like devices, and be capable of making both relatively demountable and relatively permanent (e.g., soldered) connections.

Moreover, it is desirable that the microelectronic spring contact be useful in compact packaging schemes, where low cost, demountability, and resiliency are important. Exemplary applications may include portable electronic components (cellular phones, palm computers, pagers, disk drives, etc.), that require packages smaller than BGA packages. For such applications, solder bumps are sometimes deposited directly onto the surface of an IC itself and used for attachment to the printed circuit board (PCB). This approach is commonly referred to as direct chip attach or flip-chip. The flip-chip approach is subject to various disadvantages. One key disadvantage is the requirement for a polymer underfill beneath a die. The underfill is required to reduce thermal stresses caused by the relatively low thermal expansion of the silicon die relative to the typically much higher expansion of resin-based PCB's. The presence of the underfill often makes it infeasible to rework the component. Consequently, if the IC or its connection to the PCB is defective, the entire PCB usually must be discarded.

Another type of BGA package, the chip-scale ball grid array or a chip scale package (CSP), has been developed to overcome this disadvantage of flip-chips. In a chip scale package, solder ball terminals are typically disposed underneath a semiconductor die in order to reduce package size, and additional packaging elements are present to eliminate the need for underfill. For example, in some CSP's, a soft compliant elastomer layer (or elastomer pad) is disposed between the die and the solder ball terminals. The solder ball terminals may be mounted onto a thin 2-layer flex circuit, or mounted to terminals on the complaint member. The IC is typically connected to terminals on the flex circuit or elastic member using a wire or tab lead, and the entire assembly (except the ball grid array) is encapsulated in a suitable resin.

The elastomeric member is typically a polymer, such as silicone, about 125 μm to 175 μm (5–7 mils) thick. The elastomer pad or layer essentially performs the function of and replaces the underfill used in flip-chips, that is, minimizes thermal mismatch stress between the die and the PCB. In other CSP designs, the IC is adhered directly to the surface of a two-layer flex circuit, and connected to terminals on the chip side of the flex circuit using wire leads. Solder balls are mounted on an opposite surface of the flex circuit. This design lacks an elastomer layer for decoupling the die from the PCB and, therefore, may not eliminate the need for underfill.

Current chip-scale package designs have a number of shortcomings. The elastomeric materials tend to absorb moisture, and if excessive moisture is absorbed, rapid outgassing of this moisture at reflow temperatures may cause the formation of voids in the elastomer layer, or bursting of the package. For example, moisture may be released from polymer materials in the elastomer and become trapped within the die attachment adhesive. Voids may then be formed when this trapped moisture expands during board assembly heating operations, typically causing cracking and package failure. Formation of such voids may be particularly problematic during reflow attachment to a PCB.

Another difficulty with chip-scale package designs is the process for integrating the elastomer member, which is typically done by picking and placing elastomer pads onto individual sites, or by screen printing and subsequently curing a fluid polymer. In either case, it may be difficult to meet the tight tolerances and package flatness required for a CSP application. For example, in a typical CSP design, the package flatness (planarity) should be less than about 25 μm (1 mil) to ensure that all solder balls establish contact with PCB upon reflow. This level of flatness may be difficult to achieve using prior art processes for depositing the elastomeric materials.

Therefore, it is further desirable to provide an improved microelectronic contact element for applications such as CSPs and flip-chips.

SUMMARY OF THE INVENTION

The structure of the spring contacts according to the present invention may be understood by considering an exemplary method by which they may be fabricated. In an initial step of the method, a precisely shaped pit, such as a pyramidal pit, is formed in a sacrificial substrate using any suitable technique, for example, etching or embossing. Typically, a large array of identical pits will be formed at the same time in the sacrificial substrate, arranged in a pattern corresponding to the desired position of the contact tips to be formed on the electronic device. The surface of the pits may then be coated, if necessary, with a thin layer of a suitable release material, such as polytetrafluoroethylene (PTFE). The pits may then be filled with a suitable fluid elastomer, or similar compliant material. The elastomer or compliant material is preferably free of any filler materials, such as conductive fillers. The sacrificial substrate may then be mated to the device substrate on which the spring contacts are to be formed, the elastomer cured (solidified) in place, thereby adhering the elastomer to the device, and the sacrificial substrate removed. In the alternative, the elastomer or compliant material may be cured before the sacrificial substrate is mated to the device substrate, and the compliant members adhered to the device process by some other method, such as application of heat or by a suitable adhesive. As yet another alternative, dots of a polymer material may be applied to the device substrate by, for example, screen printing, and the pit features then pressed against the dots to mold the dots.

As a consequence of the foregoing steps, the device substrate should be populated with at least one compliant pad or protrusion, and typically, a plurality of compliant pads, positioned away from the working terminals of the device substrate. For most applications, the pads are preferably of similar or nearly identical height and shape, having a relatively wide base and a pointed top. Of course, the pads may be different sizes and/or shapes depending on the requirements of the intended application. Suitable shapes may include pyramids, truncated pyramids, stepped pyramids, prisms, cones, quadrangular solids, and similar shapes. The pads may be essentially solid and homogenous, or may include voids, bubbles, layers, and the like. It is not necessary that conductive contact be established between the compliant members and the device substrate. To the contrary, the compliant members are preferably positioned so as avoid contact with terminals on the device substrate. Also, the compliant pads will generally be distributed in a pitch-spreading pattern relative to the terminals on the device substrate.

In an embodiment of the invention, the compliant pads are primarily elastic, meaning that they are configured to spring back to their original positions after an applied load is removed. In alternative embodiments, the compliant pads may be primarily inelastic, meaning that they will not spring back to their original positions after the applied load is removed; or the compliant pads may be configured to exhibit some combination of elastic and inelastic behavior. One of ordinary skill may select different materials and pad geometries to obtain the desired response characteristics under anticipated load conditions.

In an embodiment of the invention, the device substrate, including the protrusions, may be coated with a thin metallic seed layer, such as a titanium-tungsten layer, applied by any suitable process such as sputtering. One or more uniform conformal layers of a sacrificial material, such as an electrophoretic resist material, is then applied over the device substrate. The sacrificial layer is then patterned as desired to expose the seed layer in a pattern of traces extending from the terminals of the device substrate to respective tops of the compliant pads. The trace pattern may be made wider over the compliant pads for greater stiffness and strength of the resulting contact structures.

A metallic resilient and/or conductive layer is then plated to the desired depth over the partially exposed seed layer. Nickel or nickel alloy material is generally preferred, plated to a depth sufficient to be suitably strong and resilient. In an embodiment, the nickel material is plated to sufficient depth so the resulting trace is stiffer than the compliant pads. Optionally, the resilient layer is coated with a protective and conductive layer, such as a thin layer of gold, after the plating step. After the desired metallic layers are applied, the layer of sacrificial material and the excess seed layer are removed using processes that leave the compliant protrusions and metal traces on the device substrate.

The resulting structure is then ready to use without further processing, and comprises a metal trace integral with a spring contact running from each desired terminal of the device substrate to the top of a respective one of the compliant pads. Preferably, a pointed top of each compliant pad has imparted a relatively sharp pointed tip to each spring contact by the highly conformal plating process. Each contact extends both laterally and vertically from the base of each compliant pad to the top of each pad, providing a cantilevered structure that imparts a beneficial wiping action to the motion of the contact tip when the spring contact is deflected. The spring contacts are advantageously supported by the compliant pad during use.

The support of the compliant material may enable use of a thinner plated layer for the spring contacts than would otherwise be required to provide adequate contact forces. The thinner plated layer, in turn, may save substantial processing time during the plating step. Also, the foregoing method avoids any need for contouring or molding of a sacrificial layer, any need for separate forming steps for providing a sharp contact tip, and any need for a separate step to provide redistribution traces.

In an alternative embodiment, the plating step and the related steps of applying the seed layer and applying and patterning the resist layer are omitted. Instead, the desired traces and contact elements are patterned directly onto the device substrate and elastomer protrusions by a method such as sputtering or vapor deposition.

In another alternative embodiment, the traces are configured for a flip-chip application that requires no elastomer pad or underfill. The traces are shaped to be resilient in a direction parallel to the device substrate. For convenience, such traces are referred to herein as "horizontal springs," and it should be apparent that "horizontal" is not limiting except in the sense of describing resiliency in the direction parallel to the device substrate. The horizontal resiliency compensates for thermal mismatch between the device substrate and the PCB or other member to which it is mounted, and thereby eliminates the requirement for underfill and for elastomer members. Optionally, the traces may also be made resilient in a direction perpendicular to the device substrate, like the spring contacts described in the references cited above.

Preferably, the horizontal spring contacts are formed on a sacrificial layer on the device substrate. Each horizontal spring contact runs between a terminal of the device and a bonding pad, such as a pad for bonding to a corresponding pad of a PCB using a solder ball or adhesive connection. Horizontal flexibility may be provided by patterning the trace in any suitable fashion, such as in a zigzag, pleated, crenulated, or serpentine pattern. The sacrificial layer is then removed, leaving each horizontal spring contact suspended above the device substrate, except where it is attached to its respective terminal. Each trace is thus made flexible in the direction parallel to the device substrate. When the free end of each trace is bonded to a mating substrate, stress arising from thermal mismatch between the device and the mating substrate is relieved by deflection of the horizontal spring contacts. Optionally, a compliant pad may be located under a contact tip of the horizontal spring contact, for additional vertical support.

A more complete understanding of the layered microelectronic contact and the horizontal spring contact will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 1 is an enlarged perspective view of an exemplary microelectronic spring contact according to the invention with a pyramidal compliant pad.

FIG. 2 is an enlarged plan view of an array of microelectronic spring contacts of the type shown in FIG. 1, showing a portion of a pitch-spreading array.

FIG. 3 is an enlarged perspective view of exemplary microelectronic spring contacts using a shared prism-shaped compliant pad.

FIG. 4 is an enlarged perspective view of an exemplary microelectronic spring contact using a hemispherical compliant pad.

FIG. 5 is an enlarged perspective view of an exemplary microelectronic spring contact using a conical compliant pad.

FIG. 6 is an enlarged side view of an exemplary microelectronic spring contact using a compliant pad in the shape of a stepped pyramid.

FIG. 7 is an enlarged side view of an exemplary microelectronic spring contact using a compliant pad in the shape of a truncated pyramid.

FIG. 12 is an enlarged plan view of an exemplary microelectronic spring contact having a relatively thin and flexible metal trace deposited over a pyramidal compliant pad.

FIG. 13 is an enlarged perspective view of the spring contact shown in FIG. 12.

FIG. 14 is an enlarged perspective view of a spring contact with offset openings in a relatively thin and flexible metal trace, for enhanced lateral flexibility.

FIG. 15A is a plan view of an exemplary flip-chip semiconductor device having an array of microelectronic spring contacts according to the invention.

FIG. 15B is an enlarged plan view of the flip-chip device shown in FIG. 15A.

FIG. 21 is a flow diagram showing exemplary steps of a method for making horizontal spring contacts according to the invention.

FIG. 22 is an enlarged plan view of an exemplary flip-chip device with an array of horizontal spring contacts.

FIG. 23 is an enlarged side view of the flip-chip device shown in FIG. 22 in contact with terminals of a substrate.

DETAILED DESCRIPTION OF THE PREFERRED EMBODIMENT

Figure 8:
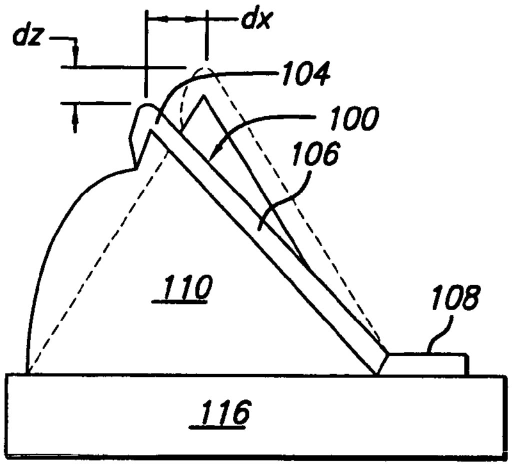
FIG. 8 is an enlarged side view of an exemplary microelectronic spring contact with a pyramidal compliant pad, showing deflection characteristics of a spring contact having a metallic trace that is relatively stiff compared to the compliant pad.

The present invention provides microelectronic spring contacts that overcome limitations of prior art spring contacts. In the detailed description that follows, like element numerals are used to describe like elements appearing in one or more of the figures.

The present invention achieves the benefits of multi-layer and single-layer lithographic spring contacts as disclosed in the patent applications referenced herein, at a potentially lower cost, and provides additional advantages for certain packaging and connecting applications. The spring contacts of the present invention are believed especially suitable for compact packaging applications, such as flip-chip packages and CSP's, where they may replace or augment the use of ball grid arrays as connection elements.

With proper selection of materials, the spring contacts may also be used for testing and burn-in applications. It is therefore within the scope and intent of the invention that spring contacts according to the invention be fabricated directly on the devices of an unsingulated wafer for initial testing and/or burn-in; remain on the devices after testing for burn-in testing before or after packaging, if desired; and then be used as the primary connection element (i.e., with or without solder or conductive adhesive) for final assembly to an electronic component. In the alternative, the spring contacts of the present invention may be used for any selected one or combination of the foregoing applications, used as secondary connection elements (e.g., IC to flex circuit) within a package incorporating other connection elements such as a BGA, used as the contact elements or interposer elements of a test probe, used within a connector such as a Land Grid Array (LGA) socket, or for any other suitable connection application.

An exemplary layered microelectronic spring contact 100 is shown in FIG. 1. Spring contact 100 comprises two primary layers of material: a first non-conductive elastomer layer in the form of pyramidal compliant pad 110, and a second conductive and resilient layer in the form of metallic trace 102. Spring contact 100 is described as layered because at least a part of a conductive layer (trace 102) overlies a non-conductive layer (pad 110) and the two layers together define the contact 100.

Compliant pad 110 may be any suitable shape within the parameters described herein. In an embodiment of the invention, it is a precisely formed shape, such as a molded shape. In alternative embodiments, pad 110 may be a less well-defined shape, such as a relatively amorphous dollop. The morphology of the pad may be imparted to a relatively rigid metallic tip and beam that are deposited over the pad surface. To ensure a high degree of uniformity across densely populated spring contact arrays, each pad may be formed using a parallel process that minimizes variability between pads. Parallel formation, such as molding en masse, provides the further benefit of requiring less time than individual dollop formation.

Specifically, pad 110 has a pyramid shape, although other suitable shapes may be used such as, for example, the pad shapes described herein. In more general terms, the pad 110 may be described as a tapered mass having a relatively large and flat base area 112 where the pad is adhered to a substrate 116, and free side surfaces 109 that extend away from the substrate and taper to a relatively small end area distal from the substrate. The end area is hidden from view in FIG. 1 by the overlaying metallic tip 104. This tapered shape maximizes the area for adhesion to the substrate 116 while efficiently supporting a defined tip structure. In this embodiment, the pyramidal shape reduce the potential for outgassing from the elastomeric material, to ventilate contact 100 from any outgassing that may occur, and to provide increased lateral flexibility for thermal stress relief across contact arrays.

A pyramidal compliant pad may be particularly suitable because pyramid shapes with the desired tapered characteristics may readily be formed with great precision and at extremely small scales by exploiting the properties of commonly available crystalline silicon materials. It is well known that a pyramidal pit, with side surfaces defined by the orientation of crystal planes in the silicon material, may readily be produced by exposing a silicon substrate covered with a suitably patterned layer of photo-resist to a suitable etchant, such as KOH. An array of substantially identical pyramidal pits may thus be produced in a silicon substrate, and the substrate with pits may be used as a mold for forming an array of identical pyramidal compliant pads. Related shapes such as prisms, truncated pyramids or prisms, and stepped pyramids or prisms may be similarly formed using suitable etching and masking process, as should be apparent to one of ordinary skill in the art.

Compliant pad 110 may be made of any suitable material. For example, suitable elastomer materials may include silicone rubber, natural rubber, rubberized plastics, and a wide variety of other organic polymer materials. One of ordinary skill in the art may select a suitable material by considering the intended operating environment (such as temperature or chemical environment) and desired structural characteristics of the spring contact. For example, a suitably soft and resilient material may be selected once the contact geometry, desired range of compressibility, and maximum contact force are defined. Preferably, the pad material is a homogenous plastic material free of any particulate filler material, and is inherently non-conductive. Homogenous plastic material may be more readily formed into a precise pad shape at small scales, such as for compliant pads that are less than about 5 mils (about 130 $\mu$m) wide.

The compliant pad 110 is adhered to substrate 116 at a location spaced apart from terminal 114 for which an electrical connection is desired. A conductive trace 102 is then deposited from the terminal 114 to the end area of the compliant pad, by a process such as electroplating. Trace 102 may be comprised of any suitable metal or metal alloy, and may include one or more layers. For example, trace 102 may be comprised of a relatively thick layer of nickel or nickel alloy for strength and rigidity, covered with a relatively thin layer of gold for conductivity. Trace 102 is preferably an integral piece of metal having a contact tip portion 104 deposited over the end area of pad 110, a pad-supported beam portion 106 running from the base 112 of pad 110 to the contact tip 104, and a substrate-supported redistribution trace portion 108 connecting the beam portion 106 to the terminal 114. Contact tip 104 may be relatively pointed (as shown) for penetrating oxide and contamination layers of a mating terminal. In the alternative, the contact tip 104 may be relatively flat for supporting features such as solder balls. Beam portion 106 may be tapered from a greater width at base 112 to a narrower neck at tip 104, as shown. This tapered design has the advantage of more uniformly distributing stresses along the beam length. In the alternative, beam 106 may be of constant width, be provided with a reverse taper (wider at the top), or have any other suitable shape. Substrate 116 may be any suitable electronic device, including but not limited to a semiconductor die or wafer, a connector or socket for a die or wafer, and a printed circuit board.

Spring contacts 100 may readily be used in a pitch-spreading array 118, as shown in FIG. 2. Terminals 114 on substrate 116 are disposed at a first pitch PI, and contact tips 104 are disposed at a coarser pitch P2, wherein P2 is greater than P1. FIG. 2 also shows various ways for positioning the redistribution portion 108 of trace 102. As shown at the bottom right of FIG. 2, the redistribution trace 108 for a more distant contact 100' may be routed completely around the compliant pad 110 of a closer contact. In the alternative, as shown at the bottom left of FIG. 2, trace 108 for a more distant contact 100" may be deposited directly over the compliant pad 110 of a less distant contact, adjacent to its base 112. Positioning traces over free areas of the compliant pads may be advantageous in very dense arrays for which space for positioning the redistribution traces is limited. Such positioning may also relieve stress in the materials from which the spring contact is formed.

FIGS. 3–7 show various alternative embodiments of the invention. FIG. 3 shows a prism-shaped compliant pad 124 supporting a plurality of spring contacts 122. The end area of pad 112 is partially exposed. Other features of the contacts 122 are similar to those described for spring contact 100. FIG. 4 shows a spring contact 130 with a hemispherical pad 132. Contact tip 104 is relatively flat. FIG. 5 shows a spring contact 134 with a conical compliant pad 136. FIG. 6 is a side view of a spring contact 140 having a compliant pad 142 in the shape of a stepped pyramid. Compared to a regular pad, the stepped pyramid pad 142 provides a lower aspect ratio, that is, a lower height for a base of given size. The lower aspect ratio may be advantageous for providing a firmer contact for applications in which a higher contact force is desired. FIG. 7 shows a side view of a spring contact 150 having a compliant pad 152 in the shape of a truncated pyramid. The truncated pyramid shape also provides a lower aspect ratio pad, and may be suitable for applications in which a flat contact tip 104 is desired. Spring contacts may be provided in various other shapes and configurations different from those depicted herein, without departing from the scope of the invention.

The relative structural properties of the compliant pad and the overlying conductive trace may be varied. In an embodiment of the invention, the compliant pad is relatively soft and flexible compared to the conductive trace. FIG. 8 shows a deflection mode of a spring contact 100 having a relatively flexible pad 110 and a relatively stiff beam 106. In this embodiment, the characteristics of the spring contact 100 are dominated by the properties of the beam 106, which will deflect under the influence of a contact force in a mode similar to how it would deflect were it not supported by the compliant pad. The contact tip 104 will accordingly move a lateral distance "dx" corresponding to a vertical displacement "dz," thereby providing a beneficial wiping action to the contact tip.

Figure 9:
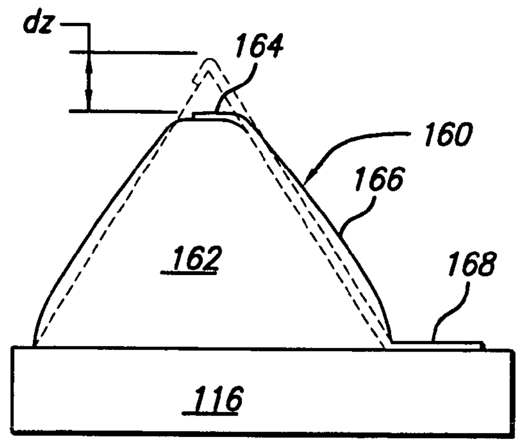
FIG. 9 is an enlarged side view of an exemplary microelectronic spring contact with a pyramidal compliant pad, showing deflection characteristics of a spring contact having a metallic trace that is relatively flexible compared to the compliant pad.

In an alternative embodiment, the conductive trace can be made relatively flexible compared to the compliant pad. FIG. 9 shows a deflection mode of a spring contact 160 having a pad-supported beam 166 that is relatively flexible compared to compliant pad 162. To achieve greater flexibility, contact tip 164, beam 166 and redistribution trace 168 may be deposited as a relatively thin layer, which advantageously may be accomplished more quickly than depositing, a relatively thick beam like beam 106. Being symmetrically supported, pad 162 will deflect a vertical distance "dz" without appreciable lateral deflection. Beam 166 and contact tip 164 bend to follow the contour of pad 162.

It should be appreciated that FIGS. 8 and 9 show deflection modes that are at opposite ends of two extremes. It may be desirable to configure a contact that operates in a mode that is intermediate between the modes shown in FIGS. 8 and 9. In an intermediate mode, the spring contact will exhibit characteristics of both deflection modes. For example, the contact tip will undergo some lateral deflection or wipe, while at the same time being substantially supported by the compliant pad. Thus, in an intermediate mode the advantages of both deflection modes— i.e., wiping action, and a thin, rapidly formed trace—may both be realized to a degree. One skilled in the art may construct a spring contact that operates in any desired deflection mode. For a given geometry and selection of materials, the beam thickness may be varied until the desired deflection mode is achieved. Computer modeling may be useful in the design phase to predict the deflection characteristics of a particular spring contact design.

Figure 10:
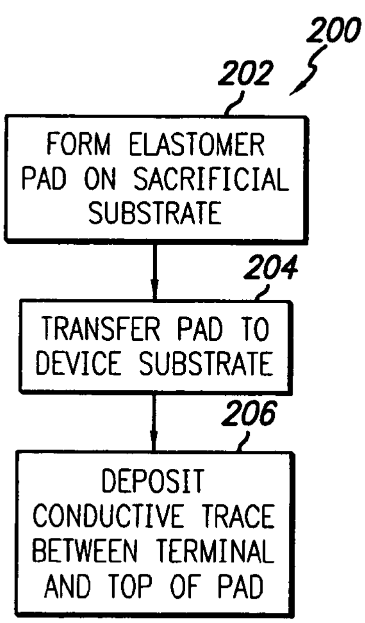
FIG. 10 is a flow diagram of showing exemplary steps of a method for forming a microelectronic spring contact according to the invention.

FIG. 10 shows exemplary steps of a method 200 for forming a microelectronic spring contact according to the invention. In initial step 202, a compliant pad is formed on a sacrificial substrate. To form an array of compliant pads, precision pits in a sacrificial substrate, such as a silicon substrate, in a pattern corresponding to the desired arrangement of contact tips in the spring contact array that is to be formed. The precision pits are formed in a shape corresponding to the desired shape of compliant pad, for example, a pyramidal pit is used to form a pyramidal pad, and so forth. Any suitable method may be used for forming the precision pits; in particular, various lithographic/etching techniques may be employed to form pits of various shapes. After the pits have been created, the sacrificial substrate is preferably coated with a thin layer of a suitable release agent, such as a PTFE material or other fluoropolymer. An alternative method of forming a compliant pad is by deposition of a dollop of uncured or softened elastomer material directly on a substrate, and then curing or hardening the elastomer in place.

After the sacrificial substrate has been prepared, the pits may be filled with the selected elastomeric material, preferably in a liquid state. The substrate on which the contacts are to be formed (the "device substrate") may then be mounted to the sacrificial substrate, and the elastomeric material cured or hardened with the device substrate in place, thereby adhering the compliant pads to the substrate. The substrate and its attached pads may then be removed from the sacrificial substrate, transferring the pads to the device substrate as indicated at step 204. The sacrificial substrate may be re-used as desired.

In the alternative, after the pits in the sacrificial substrate are filled with the liquid elastomer, the elastomer material may be cured or hardened with the sacrificial substrate left free and open. The sacrificial substrate may then be coated with a suitable adhesive material, thereby coating the exposed bases of the compliant pads. Preferably, the adhesive material is patternable, so that it may be removed from the sacrificial substrate except in regions over the elastomer material. In addition, the adhesive material is preferably pressure-sensitive, so that it will adhere on contact with a mating substrate. The compliant pads may then be transferred to the device substrate as desired.

Figure 11:
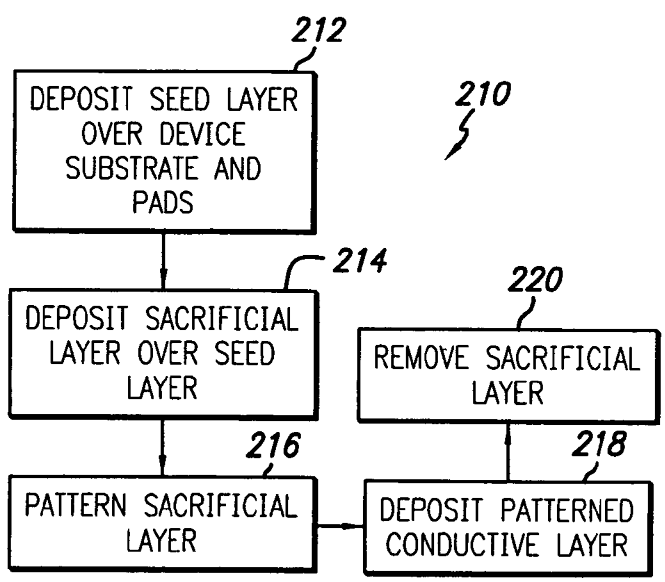
FIG. 11 is a flow diagram showing exemplary steps of a method for depositing a conductive trace between a terminal and a compliant pad.

With the compliant pads in place on the device substrate, at step 206, a conductive trace is deposited between a terminal of the device substrate and the top of a corresponding pad. FIG. 11 shows exemplary steps of a method 210 for depositing a conductive trace on a device substrate and compliant pad. At step 212, a seed layer is deposited over the entire surface of the device substrate and its attached compliant pads. One suitable seed layer is a sputtered titanium-tungsten layer; a suitable seed layer may be selected by one skilled in the art.

At step 214, a sacrificial layer is deposited over the seed layer. The sacrificial layer is a patternable material, such as a photoresist material, and is preferably applied as a highly conformal layer over the device substrate and its protruding elastomeric pads. Various methods may be used to deposit a conformal layer of resist material. One suitable coating method for thicknesses up to about 35 $\mu$m is electrodeposition (electrophoretic resist). Other methods may include spray coating, spin coating, or meniscus coating, in which a laminar flow of coating material is passed over the device substrate. A greater depth may be built up by successively coating and curing layers of material. The minimum depth of the sacrificial layer is preferably equal or greater than the desired thickness of the metallic trace to be deposited.

At step 216, the sacrificial layer is patterned to expose the seed layer in the areas where the conductive traces are to be deposited. Generally, patterning may be accomplished using any suitable photo-patterning technique as known in the art. At step 218, the conductive trace material is deposited to the desired depth over the exposed areas of the seed layer, such as by electroplating. Successive layers of different materials, such as a relatively thick layer of nickel or nickel alloy, followed by a relatively thin layer of gold or other suitable contact metal such as palladium, platinum, silver, or alloys thereof, may be applied as desired. At step 220, the sacrificial layer is removed, such as by dissolving in a suitable solvent. The device is thereby provided with an array of spring contacts according to the invention.

For spring contacts in which the metal trace is to be relatively thin and flexible, the metal trace need not be deposited by electroplating, and may preferably be deposited by a method such as sputtering or vapor deposition. In such case, the entire surface of the device substrate and compliant pad may be coated with a thin layer or layers of metal to the desired depth, as if with a seed layer. Then, a photoresist layer may be applied and patterned to protect those areas of the device substrate where a metallic trace layer is desired, and the remaining unprotected areas of the metal layer removed in an etching step. By eliminating the electroplating step, processing time may be substantially reduced for those applications that do not require a relatively stiff metallic contact element.

In the case of layered spring contacts with relatively thin and flexible metal layers, it may be advantageous to coat a greater proportion of the compliant surface, up to and including the entire surface of the compliant pad. An exemplary spring contact 170 with most of the compliant pad 171 covered by a metallic layer 172 is shown in FIGS. 12 and 13. Like the other spring contacts described herein, metal layer 172 comprises a substrate-supported redistribution portion running between a terminal of the substrate and the base of the compliant pad 171, a pad-supported portion 176 extending upwards from the base of the pad, and a contact tip 174 at the top of the compliant pad 171. In the exemplary contact 170, all four sides of the pyramidal pad 171 are covered with the metal layer 172, except for a relatively small area along the four corners of the pyramid. Covering a greater proportion of the compliant pad advantageously lowers the resistivity of the contact 170, and may also help protect the pad from damage. Openings in the metal layer over the compliant pad may be desirable for stress relief of the metal layer, to provide room for expansion (bulging) of the pad when deformed, and to provide ventilation for outgassing. Stress relief may also be provided without using openings in the metal layer, such as by providing metal layer 172 of a highly ductile material, such as gold.

FIG. 14 shows a spring contact 175 configured similarly to spring contact 170, but with laterally offset openings 177 positioned to provide lateral flexibility for the pad-supported portions 179 of trace 178. With suitably configured openings 177, the lateral flexibility of contact 175 may be increased. That is, contact 175 may be better able to accommodate lateral deflection of its contact tip relative to its base without tearing of trace 178 or other failure of the spring contact. Lateral deflection forces may arise from thermal mismatch between the device substrate and a mating substrate, particularly when contact 175 is soldered at its tip 174 to a mating substrate.

FIG. 15A shows a plan view of an exemplary flip-chip device 180 having an array of microelectronic spring contacts 100 on a surface thereof. An enlarged view of the same device 180 is shown in FIG. 15B. Each contact 100 is connected to a terminal 114 of the device 180, as previously described. Device 180 may be a semiconductor device, such as a memory chip or microprocessor. Spring contacts 100 may be formed directly on device 180, preferably prior to singulation from the semiconductor wafer. Contacts 100 may then be used to connect to the device for both testing and assembly purposes. Although flip-chip mounting represents the more compact design, it should be appreciated that contacts 100 may similarly be incorporated into CSP designs, if desired.

Figure 16:
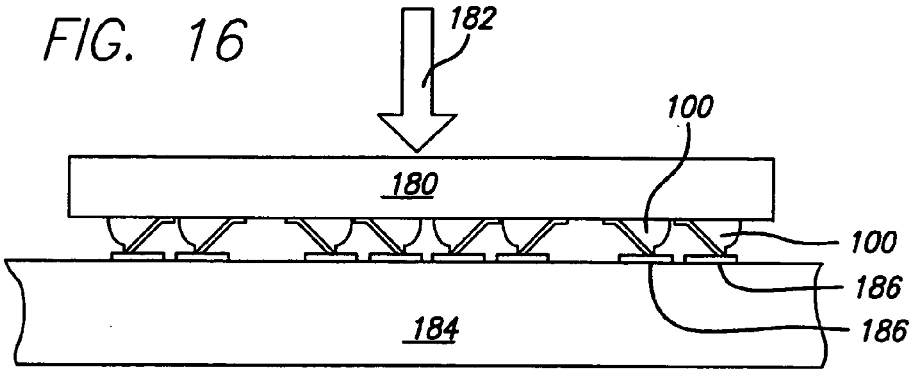
FIG. 16 is an enlarged side view of an exemplary flip-chip device with readily demountable microelectronic spring contacts according to the invention.

FIG. 16 shows a side view of device 180 in contact with a mating electrical component 184, such as a printed circuit board. A contact tip of each contact 100 is in contact with a terminal 186 of component 184. A controlled amount of compressive force 182 may be applied using a mounting frame or other fastening device, if it is desired to make the installation of device 180 readily demountable. The compressive force 182 causes deflection of contacts 100 in a direction perpendicular to substrate 184, and in a lateral direction parallel to substrate 184. The lateral deflection of contacts 100 may provide a beneficial wiping action at the contact tips. Device 180 may be demounted as desired by releasing the compressive force 182. If contacts 100 are not soldered to terminals 186, lateral stress from thermal mismatch between substrate 184 and device 180 may be relieved by sliding between the contact tips of contacts 100 and terminals 186. If contacts 100 are soldered in place, it may be desirable to provide contacts with inherent lateral flexibility.

Figure 17:
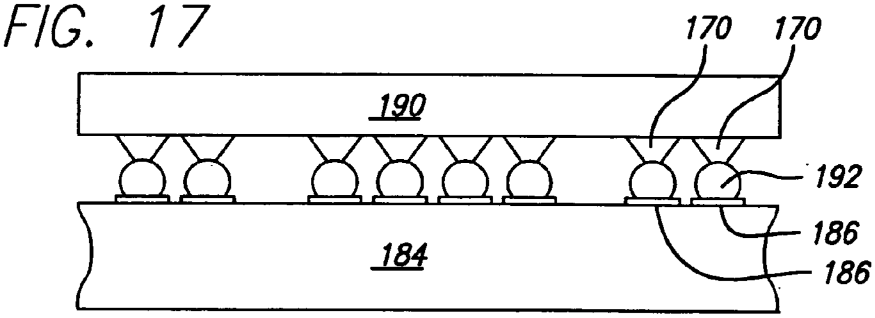
FIG. 17 is an enlarged side view of an exemplary flip-chip device with solderable microelectronic spring contacts according to the invention.

For example, contacts 170 of a type as shown in FIGS. 12–14 may be provided on a device 190 that is to be soldered to a component 184, as shown in FIG. 17. The metallic portions of contacts 170 are relatively thin and flexible, and may be patterned for greater lateral flexibility as described elsewhere herein. The metallic portions of contacts 170 are not self-supporting, and rely on the compliant pad of each contact for support. Device 190 may be mounted to terminals 186 using dollops of a solder paste material 192. The compliant pad material used in contacts 170 should be selected to withstand solder reflow temperatures encountered during mounting. After being soldered, contacts 170 remain capable of deflecting laterally at relatively low force levels for relief of thermal stress. Also, ample space remains between contacts 170 on device 190 for venting of the spring contact array, so the likelihood of package failure by gas build-up an elastomer or other material of the compliant pads may be reduced.

Figure 18:
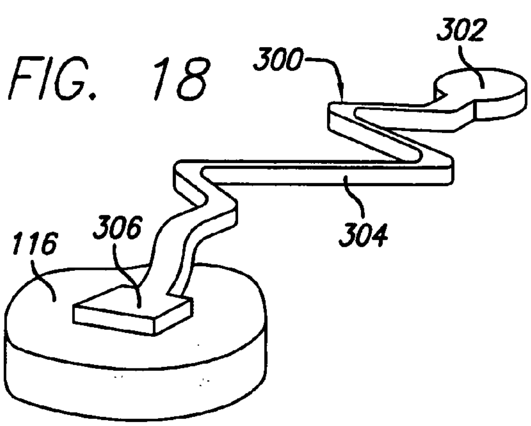
FIG. 18 is an enlarged perspective view of a horizontal spring contact according to the invention.

For some flip-chip and CSP applications, it may be desirable to eliminate the need for a compliant pad in the spring contact. A suitable self-supporting spring contact 300 for providing lateral resiliency in flip-chip and like applications without need for a compliant supporting pad is shown in FIG. 18. Spring contact 300 is an example of a microelectronic spring contact of a type referred to herein as a horizontal spring contact, meaning that the spring contact is primarily resilient in a direction parallel to the surface of the substrate to which it is mounted. Contact 300 comprises a base 306 attached to substrate 116, a cantilevered beam 304 running in a plane substantially parallel to substrate 116 and having at least one bend along its length, arid a contact tip 302 configured for a solder attachment. Contact 300 may be formed from an integral sheet of resilient and conductive material, such as a relatively thick nickel alloy trace deposited by a method such as electroplating. Contact 300 may be coated with an outer layer of a conductive metal, such as gold, or coated in any other desired way.

Figure 19:
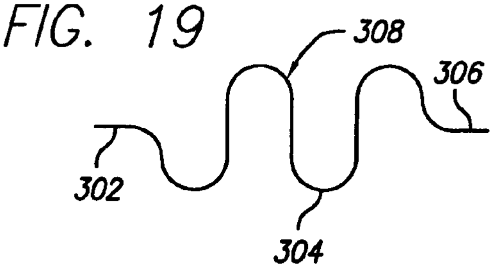
FIG. 19 is an enlarged plan view of a serpentine horizontal spring contact according to the invention.
Figure 20:
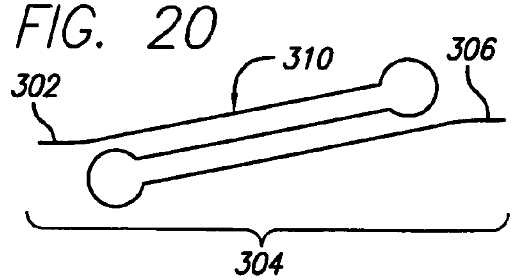
FIG. 20 is an enlarged plan view of a horizontal spring contact having a hairpin-shaped beam portion.

Various beam shapes may be suitable for horizontal spring contacts. FIGS. 19 and 20 show plan views of exemplary beam shapes that may be suitable. Referring to FIG. 19, spring contact 308 has a serpentine beam 304. Each bend in the beam 304 may add additional resiliency in the line of direction between base 306 and tip 302. Referring to FIG. 20, a series of hairpin bends in beam 304 are used to provide resiliency between base 306 and tip 302 of spring contact 310. The hairpin design may provide greater horizontal resiliency in a narrower space between the base and tip. It should be apparent that numerous other shapes may also be suitable for beam 304. One skilled in the art may select a suitable shape that is suitably rigid and self-supporting in the vertical (perpendicular to substrate) direction while being sufficiently flexible and resilient in the horizontal direction.

Exemplary steps of a method 250 for forming horizontal spring contacts according to the invention are shown in FIG. 21. At step 252, a first sacrificial layer is deposited over a device substrate. At step 254, the first sacrificial layer is patterned to expose the terminals of the device substrate. Additional areas may be exposed in which structures for supporting the spring contacts (particularly those with long spans) may be formed. The first sacrificial layer may be any patternable material, such as a photoresist material used in the art of photo-lithography. It should be deposited in a layer of uniform thickness equal to the desired height of the horizontal springs above the substrate surface. The first sacrificial layer may then be patterned using a photolithographic technique such as known in the art to expose an area of the substrate surface including and around the terminals of the device. The exposed area should be large enough to support the horizontal spring that is to be constructed against its anticipated vertical and horizontal loads.

After the terminals of the device have been exposed, and while most of the first sacrificial layer remains on the substrate, at step 256, a seed layer as previously described is deposited over the first sacrificial layer and exposed terminal areas. At step 258, a second sacrificial layer is deposited over the seed layer. The second sacrificial layer should also be a photo-patternable material, and should be deposited to a uniform depth equal to or greater than the desired thickness of the horizontal spring material. At step 260, the second sacrificial layer is patterned in the desired shape of the horizontal springs to be formed. The seed layer is exposed from each terminal area along a beam running over the first horizontal layer to a tip, which may be a pad-shaped tip.

A layer of conductive material is then deposited in the patterned second sacrificial layer at step 262, such as by electroplating a metallic material to the desired thickness. The conductive material will accordingly be deposited only over the exposed seed areas to provide a spring contact structure of the desired shape. The conductive material should be selected according to the desired structural and electrical properties of the horizontal spring contacts. For example, a nickel or nickel alloy material could be selected as the primary structural material for strength and resiliency, and a secondary layer of a more conductive material, such as gold, could be applied as a top layer. One skilled in the art will recognize other suitable materials and combinations of materials, that may be applied in any number of layers. After the conductive material or materials have been deposited, the first and second sacrificial layers are removed at step 264, such as by dissolution in a suitable solvent, to expose free standing horizontal spring contacts on the device substrate.

A plan view of an exemplary semiconductor device 312 provided with an array 314 of horizontal spring contacts 300 is shown in FIG. 22. Device 312 may be suitable for use in a flip-chip mounting application. Each spring contact 300 has a base area 306 adhered to a terminal 316 of device 312, a beam 304 running above and substantially parallel to the device substrate and having at least one bend, and a end area 302. End area 302 may be pad-shaped for accepting a solder ball or dollop of solder paste or other bonding material. The spring contacts 300 of array 314 are arranged to provide a pitch-spreading redistribution scheme for terminals 316 of device 312. In the alternative, the contact tips 302 of contacts 300 may be arranged in a pitch-preserving or pitch-reducing reducing pattern.

FIG. 23 shows device 312 in a flip-chip mounting configuration to an electronic component 184. A solder ball 192 is used to connect each contact tip 302 to a corresponding terminal 186 of component 184. Beams 304 are generally parallel to the facing surfaces of device 312 and component 184, while being held apart from both device 312 and component 184, and free to flex along their length in a horizontal direction. Stress build-up by thermal mismatch between device 312 and component 184 may thereby be mitigated by flexure of the horizontal spring contacts 300. No elastomer material is needed to isolate the device from the component, and the horizontal contacts 300 may be used for complete support of device 312. In the alternative, auxiliary floating supports (not shown) may be used to support the device 312 above component 184, in which case contacts 300 may be made even more flexible.

Figure 24:
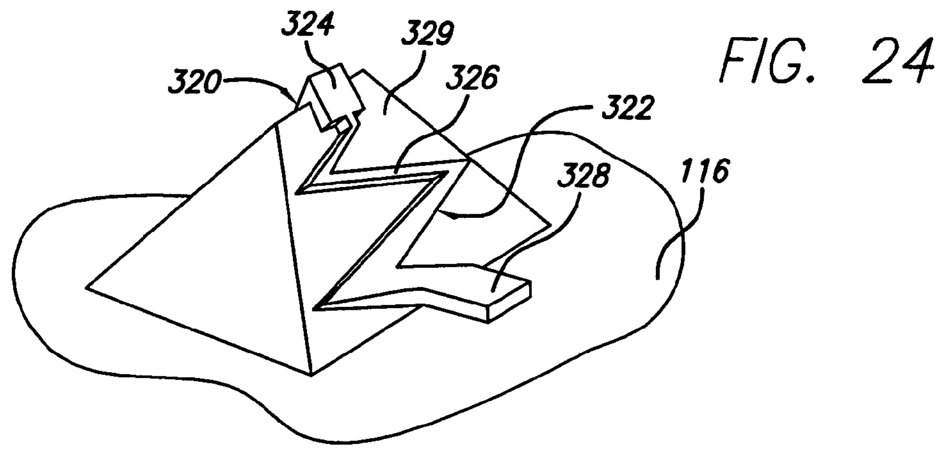
FIG. 24 is an enlarged perspective view of a horizontal spring contact in combination with a pyramidal compliant pad.

Spring contacts may also be constructed that combine the characteristics of pad-supported and horizontal spring contacts. FIG. 24 shows an exemplary combination spring contact 320, having a metallic trace 322 lain over a prism-shaped compliant pad 329, and a wiping-type contact tip 324. Beam 326 is shaped in a zig-zag pattern over pad 329, for greater horizontal flexibility. Various other horizontally flexible shapes, e.g., serpentine, may also be used. A substrate-supported terminal portion 328 extends directly from the base of the prism-shaped pad 329 over substrate 116.

Figure 25:
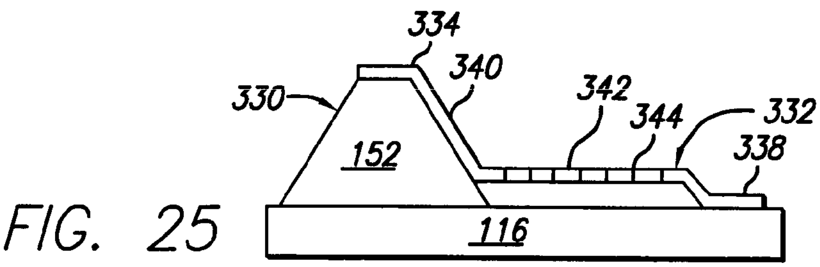
FIG. 25 is an enlarged side view of a horizontal spring contact in combination with a compliant pad in the shape of a truncated pyramid.
Figure 26:
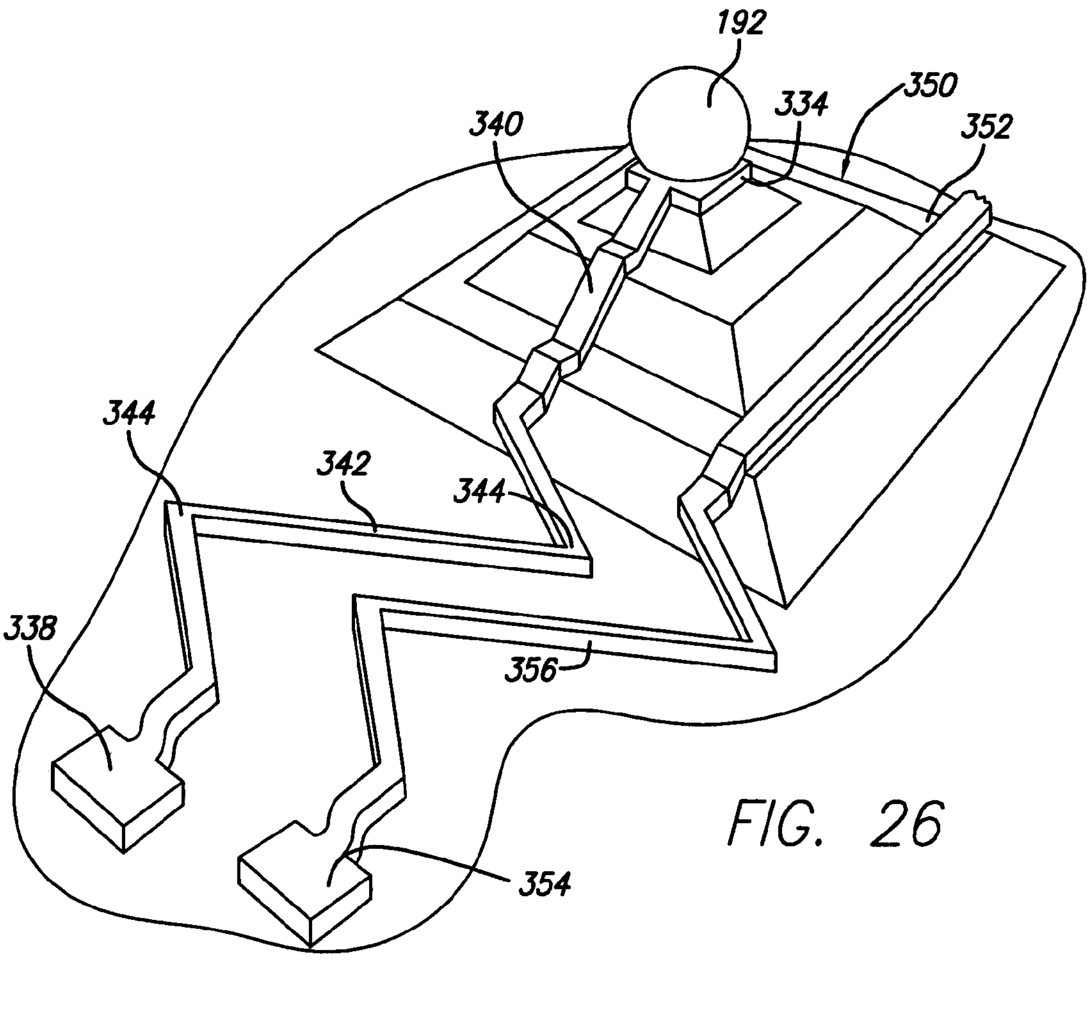
FIG. 26 is an enlarged perspective view of a horizontal spring contact in combination with a compliant pad in the shape of a stepped pyramid.

In an alternative embodiment, a spring contact may be provided with a horizontally flexible portion extending from above the base of a compliant pad to a terminal of a substrate. FIGS. 25 and 26 show spring contacts 330, 350 of this general type. A side view of a terminal 330 having a compliant pad 152 of a truncated pyramidal shape is shown in FIG. 25. Metallic trace 332 comprises: a contact tip 334 at the top of the compliant pad 152; a pad-supported portion 340 connected to the contact tip 334; an end-supported portion 342 having multiple bends 344 connected to portion 340 and extending from the compliant pad 152, running above and free from substrate 116; and a substrate-supported portion 338 connecting portion 342 to a terminal of substrate 116. Because its contact tip 334 is supported by the compliant pad 152, trace 332 may be made more flexible than might otherwise be possible. Being thinner and more flexible, end-supported beam portion 342 may provide greater horizontal flexibility as compared to a cantilevered structure like spring contact 300 shown in FIG. 18. A spring contact of the type shown in FIG. 25 may thus be especially preferred for applications requiring greater mitigation of horizontal thermal stresses and wherein the presence of a compliant pad is not problematic.

A similar combination contact 350, utilizing a stepped pyramidal compliant pad 352, is shown in FIG. 26. The contact tip 334 is provided with a solder ball 192 for subsequent attachment to a component substrate. Pad-supported trace portion 340 follows the contours of the pad 352 to a point adjacent to and above its base. From there, an end-supported portion 342 with two bends 344 extends to a substrate-supported pad 338 on substrate 116. Spring contact 350 may be made relatively firm and stable in the vertical direction by its supporting pad 352, while retaining a high degree of flexibility in a plane parallel to the substrate 116 by its flexible, end-supported portion 342.

A second trace portion 356 is also shown in FIG. 26. Second trace portion 356 runs over a portion of compliant pad 352 to a second compliant pad and a second contact tip. The second pad and tip are not shown in FIG. 26, but may be similar to pad 352 and contact tip 334, or may be differently configured.

One skilled in the art may construct a spring contact of the type shown in FIGS. 25–26 by suitably combining the steps of methods 200 and 250 described herein. For example, the end-supported portion may be formed by depositing a first resist layer over a pad (e.g., 152 or 352) and a substrate 116, and then selectively removing regions of the first resist layer over the pad and terminal. A seed layer may then be deposited over the first resist layer and the exposed areas of pad and terminal. Then, a second resist layer is deposited over the seed layer and patterned to reveal the seed layer in the pattern of the desired traces. The traces are then plated onto the exposed seed layer and the resist layers are removed to reveal a contact like contacts 330, 350.

Having thus described a preferred embodiment of the layered microelectronic contact and the horizontal spring contact, it should be apparent to those skilled in the art that certain advantages of the within system have been achieved. It should also be appreciated that various modifications, adaptations, and alternative embodiments thereof may be made within the scope and spirit of the present invention. For example, particular shapes of compliant pads and horizontal spring contacts have been illustrated, but it should be apparent that the inventive concepts described above would be equally applicable to other shapes and configurations of pads and metallic elements having the general properties described herein.

As another example, the spring contacts described herein may be used with any electronic component, including not only semiconductor devices but (without limitation) probe cards and other testing devices. As yet another example, additional materials may be deposited on the spring contact structures described above; such materials enhancing the strength, resiliency, conductivity, etc. of the spring contact structures. As still another example, one or more layers of materials may be formed on the electronic component prior to or after creating the spring contact structures as described above. For example, one or more layers of redistribution traces (separated by insulative layers) may be formed on the electronic component followed by formation of the spring contacts on the redistribution layer. As another example, the spring contacts may first be formed followed by formation of one or more layers of redistribution traces. Of course, all or part of the compliant layer (e.g., elastomeric layer) described with respect to any of the figures may be removed.

What is claimed is:

1. A microelectronic contact comprising:

a rigid substrate comprising a plurality of conductive terminals disposed on a surface thereof;

a plurality of compliant pads each comprising a base adhered to the surface of the substrate, side surfaces extending away from the substrate and tapering to an end area distal from the substrate; and a plurality of traces each extending from one of the terminals over a portion of the side surfaces of one of the compliant pads to the end area of the compliant pad, wherein at least a portion of the end area is covered by the trace and a portion of the trace that is over the compliant pad is supported by the compliant pad, wherein the compliant pads do not encapsulate the terminals.

2. The microelectronic contact of claim 1, wherein the compliant pad is spaced apart from the terminal.

3. The microelectronic contact of claim 1, wherein the trace extends over and is in contact with the substrate between the terminal and the compliant pad for a span greater than a maximum width of the trace.

4. A microelectronic contact comprising:

a compliant pad and having a base adhered to a substrate, side surfaces extending away from the substrate and tapering to an end area distal from the substrate; and a trace extending from the terminal of the device over a portion of the side surfaces of the compliant pad to the end area, wherein at least a portion of the end area distal from the substrate is covered by the trace and a portion of the trace that is over the compliant pad is supported by the compliant pad, wherein the trace includes an end-supported portion between the compliant pad and the terminal, the end-supported portion supported at a first end by the compliant pad, at a second end by the substrate, and being suspended above the substrate between the first end and the second end.

5. The microelectronic contact of claim 4, wherein the end-supported portion of the trace further includes at least one bend in a plane parallel to the substrate.

6. The microelectronic contact of claim 1, wherein the compliant pad is essentially non-conductive.

7. The microelectronic contact of claim 1, wherein the compliant pad is a shape selected from a pyramid, a truncated pyramid, a prism, a truncated prism, a cone, a truncated cone, and a hemisphere.

8. A microelectronic contact comprising:

a compliant pad and having a base adhered to a substrate, side surfaces extending away from the substrate and tapering to an end area distal from the substrate; and a trace extending from the terminal of the device over a portion of the side surfaces of the compliant pad to the end area, wherein at least a portion of the end area distal from the substrate is covered by the trace and a portion of the trace that is over the compliant pad is supported by the compliant pad, wherein the trace comprises one of a nickel material or a gold coating.

9. The microelectronic contact of claim 1, wherein the compliant pad consists essentially of a material selected from silicone rubber, polyepoxide, polyimide, and polystyrene.

10. The microelectronic contact of claim 1, wherein the trace is more flexible than the compliant pad.

11. The microelectronic contact of claim 1, wherein the trace is more rigid than the compliant pad.

12. The microelectronic contact of claim 1, wherein a portion of the trace that is over the compliant pad extends horizontally over the substrate for a distance that is at least as great as a vertical distance of a distal end of the trace away from the substrate.

13. A method for making a microelectronic contact, comprising:

providing a compliant pad comprising a base adhered to a device substrate, at least one side surface of the pad extending away from the device substrate at an angle to an end area distal from the substrate; and forming a trace from a terminal on the substrate to the end area of the pad, wherein said forming step comprises forming at least part of said trace on said compliant pad.

14. The method of claim 13, wherein the providing step further comprises:

forming a compliant pad on a sacrificial substrate;

transferring the compliant pad to the device substrate.

15. The method of claim 14, wherein the transferring step further comprises transferring the compliant pad to the device substrate at a location spaced apart from a terminal of the device substrate.

16. A method for making a microelectronic contact, comprising:

providing a compliant pad comprising a base adhered to a device substrate, at least one side surface extending away from the device substrate at an angel to an end area distal from the device substrate; and patterning a trace from a terminal of said substrate to the end area, wherein the patterning a trace step further comprises:

depositing a conformal layer of sacrificial material over the device substrate and compliant pad;

patterning the conformal layer to form a trench extending from the terminal to the end area;

plating a metallic material in the trench; and removing the conformal layer from the device substrate.

17. A method for making a microelectronic contact, comprising:

providing a compliant pad comprising a base adhered to a device substrate, at least one side surface extending away from the device substrate at an angel to an end area distal from the device substrate; and patterning a trace from a terminal of said substrate to the end area, wherein the patterning a trace step further comprises depositing a metallic material by a method selected from chemical vapor deposition, physical vapor deposition, and sputtering.

18. A method for making a microelectronic contact, comprising:

providing a compliant pad comprising a base adhered to a device substrate, at least one side surface extending away from the device substrate at an angel to a end area distal from the device substrate; and patterning a trace from a terminal of said substrate to the end area, wherein the providing step further comprises:

forming a compliant pad on a sacrificial substrate;

transferring the compliant pad to the device substrate; and wherein the forming a compliant pad step further comprises etching a pit in the sacrificial substrate.

19. The method of claim 18, wherein the etching a pit step further comprises etching a pit having a shape selected from pyramidal, truncated pyramidal, stepped pyramidal, conical, hemispherical, prism-shaped, and truncated prism-shaped.

20. The method of claim 18, wherein the forming a compliant pad step further comprises filling the pit with a liquid elastomer material.

21. The method of claim 20, further comprising curing the liquid elastomer material while it is in the pit.

22. The method of claim 21, further comprising contacting the liquid elastomer material with the device substrate during the curing step.

* * * * *